US007391236B2

(12) United States Patent
Lewis et al.

(10) Patent No.: US 7,391,236 B2
(45) Date of Patent: Jun. 24, 2008

(54) DISTRIBUTED MEMORY IN FIELD-PROGRAMMABLE GATE ARRAY INTEGRATED CIRCUIT DEVICES

(75) Inventors: David Lewis, Toronto (CA); Paul Leventis, Toronto (CA); Vaughn Betz, Toronto (CA); Thomas Yau-Tsun Wong, Markham (CA); Andy Lee, San Jose, CA (US); Philip Pan, Fremont, CA (US)

(73) Assignee: Altera Corporation, San Jose, CA (US)

( * ) Notice: Subject to any disclaimer, the term of this patent is extended or adjusted under 35 U.S.C. 154(b) by 105 days.

(21) Appl. No.: 11/320,253

(22) Filed: Dec. 27, 2005

(65) Prior Publication Data

US 2007/0146178 A1 Jun. 28, 2007

(51) Int. Cl.
*H03K 19/177* (2006.01)
(52) U.S. Cl. .............................. 326/40; 326/41; 326/46; 326/47
(58) Field of Classification Search .................. 326/38, 326/39, 40, 41, 46, 47
See application file for complete search history.

(56) References Cited

U.S. PATENT DOCUMENTS

| 5,343,406 | A | 8/1994 | Freeman et al. |
| 5,352,940 | A | 10/1994 | Watson |
| 5,414,377 | A | 5/1995 | Freidin |
| 5,432,719 | A | 7/1995 | Freeman et al. |
| 5,550,782 | A | 8/1996 | Cliff et al. |
| 5,566,123 | A | 10/1996 | Freidin et al. |
| 5,572,148 | A | 11/1996 | Lytle et al. |
| 5,648,732 | A | 7/1997 | Duncan |
| 5,796,269 | A | 8/1998 | New |
| 5,889,413 | A | 3/1999 | Bauer |
| 6,029,236 | A | 2/2000 | Steele et al. |
| 6,128,215 | A | 10/2000 | Lee |
| 6,215,326 | B1 | 4/2001 | Jefferson et al. |
| 6,249,143 | B1 | 6/2001 | Zaveri et al. |
| 6,356,110 | B1 | 3/2002 | Reddy et al. |
| 6,411,124 | B2 | 6/2002 | Lee et al. |
| 6,462,577 | B1 | 10/2002 | Lee et al. |
| 7,193,433 | B1* | 3/2007 | Young .......................... 326/38 |

OTHER PUBLICATIONS

P. Chow et al., "A 1.2μm CMOS FPGA using Cascaded Logic Blocks and Segmented Routing", *FPGAs*, Chapter 3.2, pp. 91-102, W.R. Moore and W. Luk (eds.), Abingdon EE&CS Books, Abingdon (UK) 1991.

(Continued)

*Primary Examiner*—Daniel D Chang
(74) *Attorney, Agent, or Firm*—Ropes & Gray LLP; Robert R. Jackson

(57) ABSTRACT

Circuitry for facilitating the use of the memory elements in the look-up tables ("LUTs") of a field programmable gate array ("FPGA") as user-accessible, distributed RAM. For example, a register associated with a LUT and that is not needed in the read data path in user RAM mode can be used to register data for writing in user RAM mode. As another example, an otherwise unneeded register associated with a LUT can be used to provide a synchronous read address signal for user RAM mode. Several other features are shown for similarly facilitating user RAM mode with minimal (if any) additional circuitry being required in the FPGA.

14 Claims, 9 Drawing Sheets

OTHER PUBLICATIONS

L. Mintzer, "FIR Filters with the Xilinx FPGA", FPGA '92 #129-#134.

"Optimized Reconfigurable Cell Array (ORCA) Series Field-Programmable Gate Arrays", Advance Data Sheet, AT&T Microelectronics, Feb. 1993, pp. 1-36 and 65-87.

*The Programmable Logic Data Book*, 1994, Xilinx, Inc., San Jose, CA, cover pages and pp. 2-5 through 2-102 ("XC4000 Logic Cell Array Families").

B. Klein, "Use LFSRs to Build Fast FPGA-Based Counters", *Electronic Design*, Mar. 21, 1994, pp. 87, 88, 90, 94, 96, 97 and 100.

A. DeHon, "Reconfigurable Architectures for General-Purpose Computing", M.I.T. Ph.D. thesis, Sep. 1996.

R. Iwanczuk, "Using the XC4000 RAM Capability", XAPP 031.000, Xilinx, Inc., San Jose, CA.

J.R. Hauser et al., "Garp: A MIPS Processor with a Reconfigurable Coprocessor", 0-8186-8156-4/97 $10.00 © 1997 IEEE, pp. 12-21.

A. Ohta et al., "New FPGA Architecture for Bit-Serial Pipeline Datapath", 0-8186-8900-5/98 $10.00 © 1998 IEEE, pp. 58-67.

"XC4000E and XC4000X Series Field Programmable Gate Arrays: Product Specification", May 14, 1999 (Version 1.6), Xilinx, Inc., San Jose, CA, pp. 6-5 through 6-72.

"Flex 10K Embedded Programmable Logic Family", Data Sheet, Jun. 1999, ver. 4.01, Altera Corporation, San Jose, CA, pp. 1-37.

"Flex 10KE Embedded Programmable Logic Family", Data Sheet, Aug. 1999, ver. 2.02, Altera Corporation, San Jose, CA, pp. 1-120.

"XC4000XLA/XV Field Programmable Gate Arrays: Product Specification", DS015 (v1.3) Oct. 18, 1999, Xilinx, Inc., San Jose, CA, pp. 6-157 through 6-170.

"Triscend E5 Configurable System-on-Chip Family", Triscend Corporation. Jan. 2000 (Version 1.00) Product Description, cover page and pp. 25-28.

"Apex 20K Programmable Logic Device Family", Data Sheet, Mar. 2000, ver. 2.06, Altera Corporation, San Jose, CA, pp. 1-208.

"Virtex 2.5V Field Programmable Gate Arrays", DS003 (v.2.0) Preliminary Product Specification, Mar. 9, 2000, Xilinx, Inc., San Jose, CA, pp. 1-72.

"Virtex-E 1.8V Extended Memory Field Programmable Gate Arrays", DS025 (v1.0) Mar. 23, 2000, Advance Product Specification, Xilinx, Inc., San Jose, CA, pp. 1 and 6.

* cited by examiner

DISTRIBUTED MEMORY IN FIELD-PROGRAMMABLE GATE ARRAY INTEGRATED CIRCUIT DEVICES

BACKGROUND OF THE INVENTION

This invention relates to programmable logic devices ("PLDs") such as those that are frequently referred to as field-programmable gate arrays ("FPGAs"). More particularly, the invention relates to the provision of memory circuitry in an FPGA that the user of the FPGA can use as random access memory ("RAM") during normal logic operation of the device. Still more particularly, the invention relates to selectively employing the circuitry of look-up tables ("LUTs") on the device that are not needed for normal LUT-based logic to provide the above-mentioned user-accessible RAM. Such RAM may be referred to as "distributed RAM" because, rather than being in a block of dedicated user RAM circuitry, it is distributed over the circuitry of several LUTs on the device.

Lewis et al. U.S. patent application Ser. No. 10/897,743, filed Jul. 22, 2004, shows improved circuitry for providing distributed RAM in FPGAs. (The Lewis et al. reference is hereby incorporated by reference herein in its entirety.) For example, the Lewis et al. reference shows sharing a single write decoder by several logic elements ("LEs"), each of which includes a LUT, on an FPGA to reduce the amount of write address circuitry that must be added to give the FPGA distributed user RAM mode capability.

Various extensions or additions to circuitry of the general type shown in the Lewis et al. reference would be helpful in many situations. For example, users often want a synchronous write so that the user does not need to provide exact timing signals for the write strobe. This necessitates provision of a write address and a write data register, but it would be desirable to avoid having to provide dedicated hardware (circuitry) for this function.

Another example of a possibly helpful extension of or addition to what is shown in the Lewis et al. reference would be application of those principles to LEs that are "fracturable" to implement a range of logic function sizes such as one six-input LUT-based logic function or two five-input LUT-based logic functions.

Still another example of a respect in which it could be helpful to extend or add to what is shown in the Lewis et al. reference relates to supporting a synchronous read function. Again, users often prefer a synchronous read, but it would be desirable to avoid having to construct dedicated hardware to support the read address register.

SUMMARY OF THE INVENTION

To facilitate the provision of user-accessible, distributed RAM on an FPGA with little additional circuitry being required on the FPGA, a register in a logic module that is not needed in the read data path of that module can be used to register a data signal to be written into the distributed RAM in user RAM mode.

As another example of what can be done to facilitate user RAM mode, a register in a logic module that is not needed in the read data path can be used to provide a registered read address signal for use in reading from the distributed RAM in user RAM mode.

Another example in accordance with the invention is use of an input to a logic module, which input is not needed by that logic module, as a source of an additional write address signal for use by write address decoder circuitry that controls writing to the distributed RAM in user write mode.

A small amount of additional multiplexing may be added to a logic module to facilitate using the RAM cells in the logic module as RAM of different depths and/or widths. Providing distributed RAM of different depths and/or widths may also be facilitated in other ways such as by including a depth mode configuration bit in the write address decoder to generate write signals into the distributed RAM depending on the mode signalled by that bit.

One or more registers may be added to the write address decoder circuitry to facilitate the provision of synchronous writing to the distributed RAM served by that decoder. The write address decoder may also be provided with timing circuits to sequence the write into the distributed RAM.

Further features of the invention, its nature and various advantages, will be more apparent from the accompanying drawings and the following detailed description.

DETAILED DESCRIPTION

Figure 1:
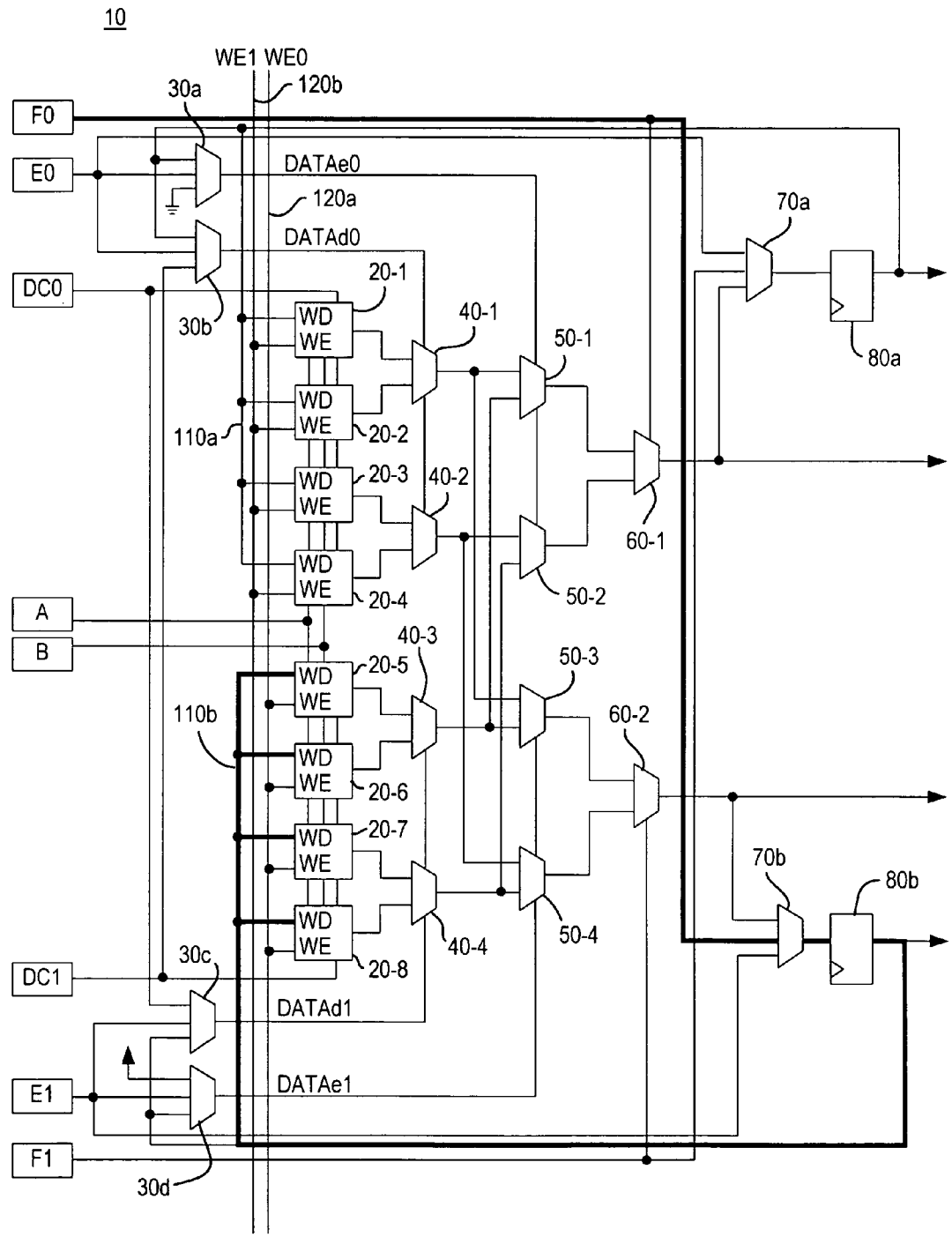
FIG. 1 is a simplified schematic block diagram of illustrative circuitry in accordance with the invention.

An example of an FPGA LE (or adaptive logic module ("ALM") or adaptive logic element ("ALE")) 10 that is basically known but that includes certain enhancements in accordance with this invention is shown in FIG. 1. Elements in FIG. 1 that are known are identified by two-digit reference numbers. Elements that are new or significantly altered are identified by three-digit reference numbers. The known elements include multiplexers 30a-d, 40-1 through 40-4, 50-1 through 50-4, 60-1, 60-2, 70a, and 70b. The known elements also include three-input look-up-tables (3-LUTs) 20-1 through 20-8, and registers 80a and 80b. Most of the interconnection circuitry shown in FIG. 1 is also known. However the feedback connections 110a and 110b have been added for purposes of the present invention. Also in FIG. 1, to facilitate tracing an illustrative signal path that can be used in accordance with the invention, that signal path is emphasized with a heavier line, although only the 110b portion of that path is actually new for purposes of this invention.

It will be understood that each of 3-LUTs 20 in FIG. 1 can be constructed in any of the ways shown in the above-mentioned Lewis et al. reference. Each of 3-LUTs 20 includes eight configuration RAM ("CRAM") cells or bits that can alternatively be used as distributed, user RAM. (For convenience herein, elements 20 will generally be referred to as 3-LUTs, even though it will be understood that they can function as either LUTs or as distributed, user RAM.) The read selection control signals for each of 3-LUTs 20 are on the three vertical leads that are applied to (and pass through) the 3-LUT. Thus, for example, ALM inputs A and B are two of these read selection control signals, and these two signals are applied to all eight of 3-LUTs 20. The third read selection control signal applied to 3-LUTs 20-1 through 20-4 is ALM input signal DC0. The third read selection control signal applied to 3-LUTs 20-5 through 20-8 is ALM input signal DC1. If it is desired to use all of the RAM cells in 3-LUTs 20-1 through 20-8 together (e.g., to provide one six-input logic function or one 64*1 user RAM), then DC0 and DC1 will have the same logical value. On the other hand, it if is desired to "fracture" ALM 10 to provide two somewhat smaller logic functions (e.g., two five-input logic functions or two four-input logic functions) or to provide two "shallower" user RAM slices (e.g., 32*2 RAM), then DC0 and DC1 can be two independently valued inputs.

The other depicted inputs to each of 3-LUTs 20 are a write data signal and a write enable signal. The nature of these signals and their use in 3-LUTs 20 will be apparent from the above-mentioned Lewis et al. reference. Two write enable signal leads 120a and 120b are provided to facilitate use of the RAM in ALM 10 as either 64*1 or 32*2 RAM. Write enable signal lead 120a serves 3-LUTs 20-5 through 20-8; write enable signal lead 120b serves 3-LUTs 20-1 through 20-4.

Not shown in FIG. 1, but present in the ALM 10 circuitry nevertheless, are write decoder output signals that are applied to each of 3-LUTs 20-1 through 20-8, preferably in a manner like any of those shown in the Lewis et al. reference. In addition to being used as shown in Lewis et al., these write decoder output signals are preferably generated in any of the ways shown in that reference. Various possible write decoder modifications in accordance with this invention are shown and described later in this specification.

Returning to reading, the first three levels of selection of RAM cell outputs are performed in 3-LUTs 20 under the control of the ALM input signals that have already been described (i.e., A, B, DC0, and DC1). Further levels of read selection are performed by multiplexers 40, 50, and 60, which can be controlled in various ways by ALM inputs DC0, DC1, E0, E1, F0, and F1. The output signals of one or both of registers 80 may also be used to provide some of this multiplexer selection control. Multiplexers 30 are involved in selecting how some of these possible selection control signals are actually routed to and therefore used by multiplexers 40 and 50. (Multiplexers 30 are typically programmably controlled by configuration RAM ("CRAM") cells that are not shown in FIG. 1. In general, the end result of all this read selection is either a 1-from-64 selection at the output of either or both of multiplexers 60, or two separate 1-from-32 selections, each of which is at the output of a respective one of multiplexers 60.

If desired, the output signal of multiplexer 60-1 can be applied to and registered by register 80a. The output signal of multiplexer 60-2 can be applied to and registered by register 80b. Multiplexer 70a allows certain other signals to be applied to and registered by register 80a. Multiplexer 70b is similar with respect to register 80b. Multiplexers 70 are typically programmably controlled by CRAM cells that are not shown in FIG. 1. The outputs of multiplexers 60 can be unregistered outputs of ALM 10. The outputs of registers 80 can be registered outputs of the ALM. The register outputs are also fed back into the ALM as shown in the FIG. In accordance with this invention (and as already mentioned), this register 80 feedback is enhanced by connections 110 to the write data inputs of 3-LUTs 20.

From the foregoing it will be seen that FIG. 1 shows the following first aspect of the invention. In a fracturable LUT, the CRAM cells for the LUT are divided into at least two partitions (e.g., the CRAM cells in 3-LUTs 20-1 through 20-4, on the one hand, and the CRAM cells in 3-LUTs 20-5 through 20-8, on the other hand). Each of these mutually exclusive partitions has its own write driver and write data input (generally indicated by leads 110a and 110b). There is also one write enable line 120a or 120b for each partition. In one mode of distributed, user RAM operation, only a single one of the write enable lines is asserted (depending on the value of some address bit), and one data bit is written into one CRAM cell in the partition enabled by the asserted write enable signal. This corresponds to the deepest mode of the LUT RAM (e.g., 64*1 mode). In another mode of user RAM operation, more than one of the write enable lines 120 is asserted, and multiple data bits are written into more than one partition of the LUT RAM. This corresponds to a shallower mode of the memory (e.g., 32*2 mode).

FIG. 1 also shows another aspect of the invention. The known circuitry of ALM 10 allows it to operate in what is sometimes referred to as "packed register mode." This is a mode in which a register 80 can be used to register an input signal E or F to the ALM (or both registers 80 can be used in this way). For example, ALM input signal E0 or F1 can be applied to register 80a via multiplexer 70a. Similarly, ALM input signal E1 or F0 can be applied to register 80b, via multiplexer 70b. This feature (with the addition of register feedback paths 110) helps ALM 10 provide low-cost synchronous writes in distributed RAM mode, as will now be described in more detail.

In FIG. 1 the heavy line shows input signal F0 being used in packed register mode to write data that is latched by the bottom register or flip-flop ("FF") 80b. By using the output of that FF as the input to the write drivers of 3-LUTs 20-5 through 20-8, a write data register can be provided at little or no extra hardware cost. FIG. 1 shows how ALM 10 can be configured to use one packed register (80b) to latch write data and provide synchronous operation for that write data. It can also be seen that in 32*2 mode, the two FFs 80a and 80b can be used to provide two different bits of input data.

In FIG. 1 the write data is routed to all necessary ALM 10 input pins (both F0 and F1) when the LUT RAM is configured in deepest (64*1) mode, because any one of several different write drivers (from paths 110a and 10b) may be used to write into some partition (i.e., either 20-1 through 20-4 or 20-5 through 20-8). However, there is then no full read path available because one of F0 and F1 is required to control the final multiplexer stage 60 in the LUT. In another aspect or embodiment of the invention a multiplexer (130, FIG. 2) is provided to at least one of the write driver inputs so that the write driver can configurably select between (a) the same write data as is provided to at least one other write driver or (b) a distinct input. In this way, one of the F0/F1 ALM 10' (FIG. 2) inputs can be used as part of a full read address.

Figure 2:
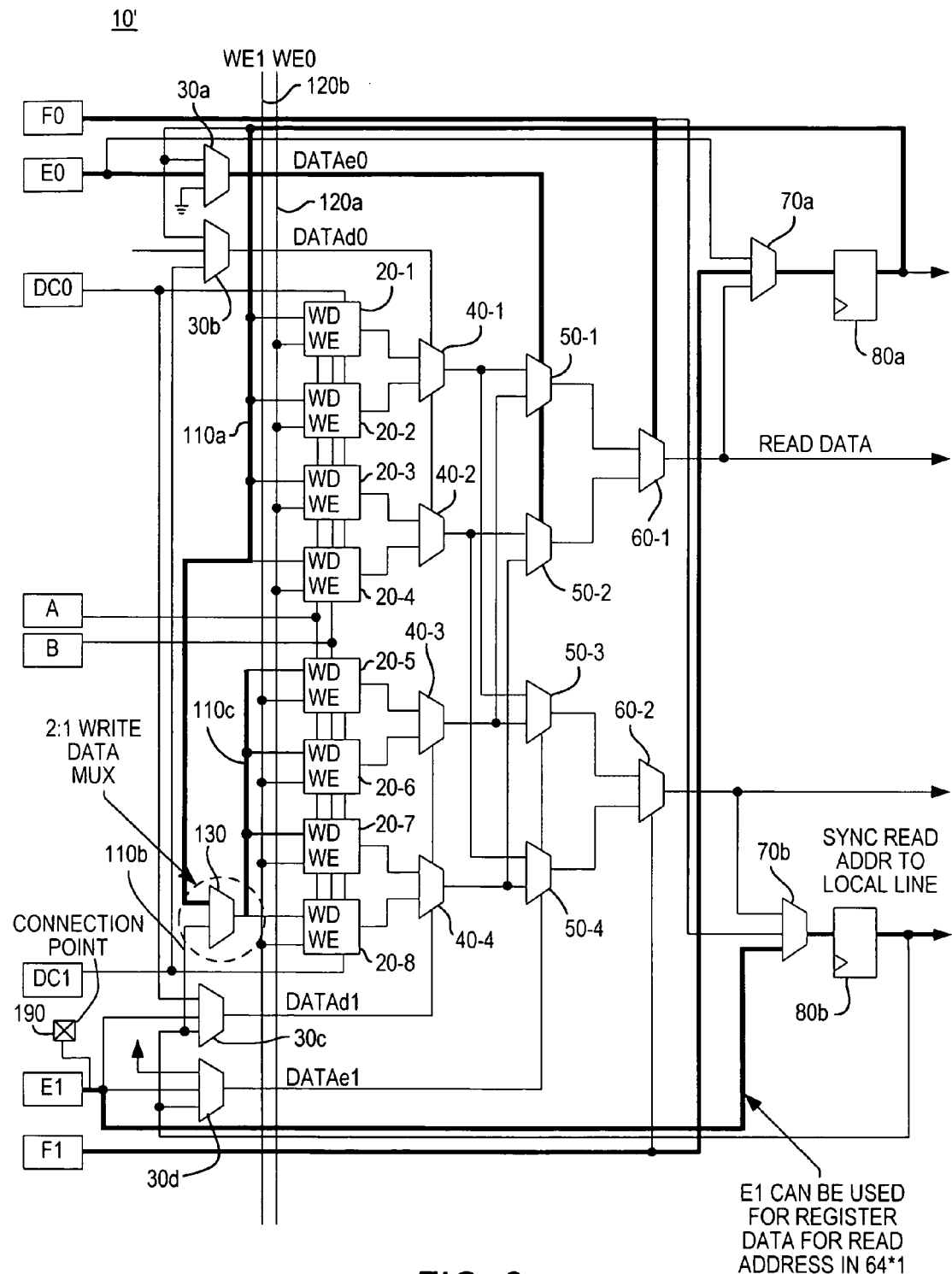
FIG. 2 is a simplified schematic block diagram of another illustrative embodiment of circuitry in accordance with the invention.

Recapitulating the above more specifically with reference to FIG. 2, as in the case of FIG. 1, ALM 10' contains 64 CRAM bits (in 3-LUTs 20) and is divided into two partitions (20-1 through 20-4 and 20-5 through 20-8) so that the ALM can operate as either 64*1 or 32*2 RAM. This involves providing two write enable lines 120a and 120b and two write data lines 110a and 110c. A write data multiplexer 130 can provide the same data to both partitions (for 64*1 mode). In other words, in this mode multiplexer connects lead 110a to lead 110c. Alternatively, multiplexer 130 can connect lead 110b to lead 110c so that different data can be supplied to the two partitions of the LUT RAM (for 32*2 mode). (Multiplexer 130 is typically programmably controlled by a CRAM bit that is not shown in FIG. 2.) In the illustrative embodiment shown in FIG. 2 F1 is used as write data and F0 is used as a read address in the deepest mode. It will be understood, however, that this is only matter of a design choice that could be reversed if desired.

Figure 3:
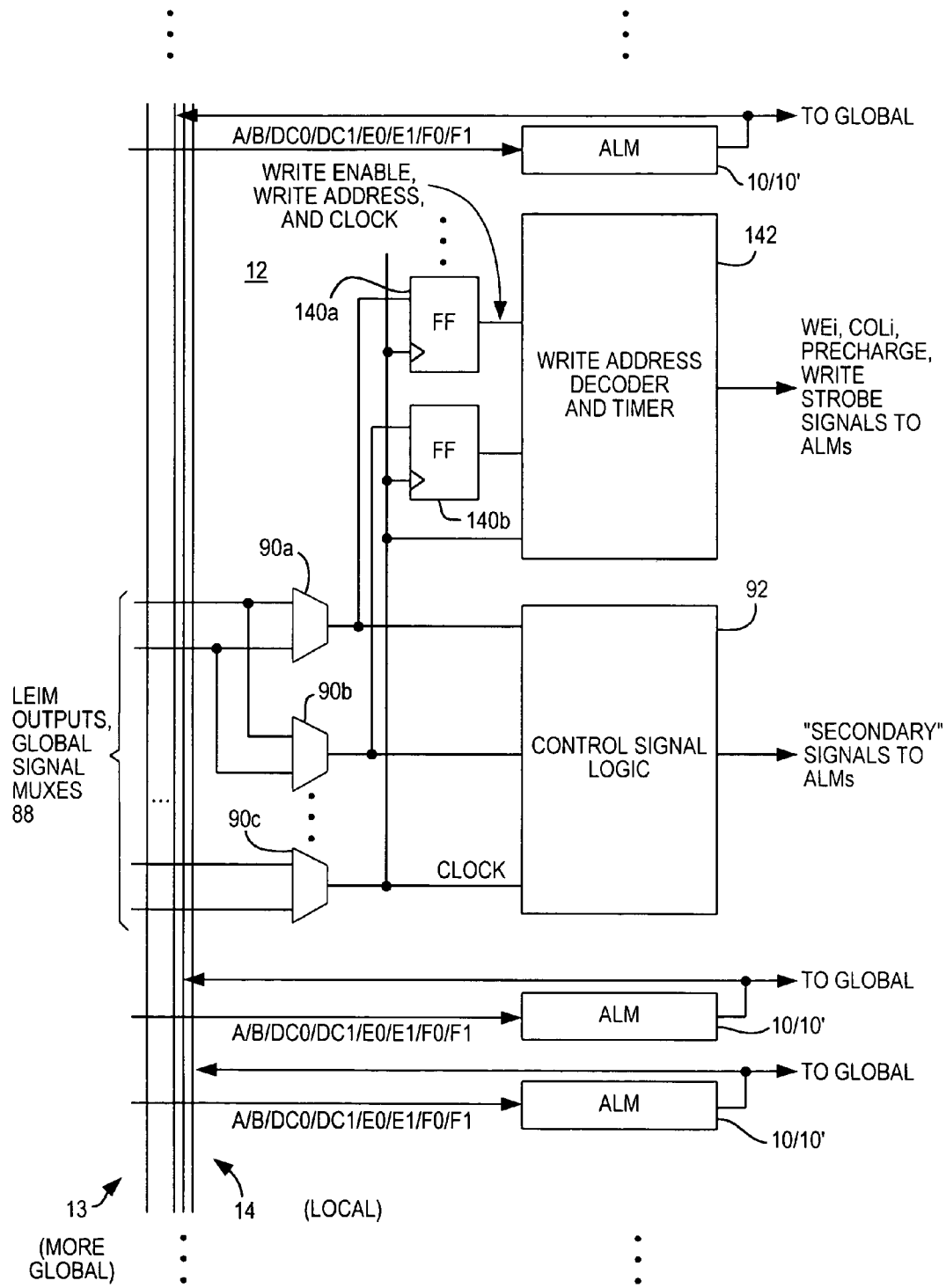
FIG. 3 is a simplified schematic block diagram of additional illustrative circuitry in accordance with the invention.

Continuing with another aspect of what is shown in FIG. 2, in the event that ALM 10' is used in 64*1 mode, it can be seen that one extra FF (80b) is available. This can be used to register one bit of a read address. All ALMs in a group of ALMs (called a logic array block or LAB (see again the above-mentioned Lewis et al. reference)) can then access that read address bit via the local interconnection resources that serve all the ALMs in the LAB but that typically do not extend beyond that LAB. (Local conductors 14 in FIG. 3 are an example of such local interconnection resources.) From such a local line, the registered read address bit can be connected to one of the read address pins A/B/etc. of one or more of the LUT RAMs in the LAB. For example, FIG. 2 shows ALM 10' input El being applied to register 80b in packed register mode. The output of register 80b is then available (as a synchronous read address bit) to all of the ALMs in the LAB that includes ALM 10'. This availability is provided via one of the local lines (14, FIG. 3) serving all of the ALMs in the LAB. In this way a read address register can be implemented in the same LAB as the LUT RAM. This structure can also be used if an optional ALM-level configuration (choice) of logic vs. LUT RAM is provided, and a memory being implemented does not use all of the ALMs in the LAB. As just one possible example of this, if some of the ALMs in a LAB are providing distributed memory, while other ALMs in that LAB are performing logic that does not require the use of both registers 80 in one or more of those logic ALMs, an unused logic ALM register can be used to help register a read address for the memory provided by the other ALMs.

As mentioned above, FIG. 2 shows how the read address signal is provided using ALM input E1. This ensures that the read address register is close to the LUTs implementing the distributed RAM, and provides both a high-speed read path, as well as reducing constraints on the place and route software to keep the read address close to the distributed RAM.

Another aspect of the invention provides a synchronous write address with better write timing and eliminates the need for the user to do so. Moreover, this is achieved at low cost. FIG. 3 shows some aspects of what is shown in the above-mentioned Lewis et al. reference, but with some additional features in accordance with this invention. A representative LAB 12 includes several ALMs 10 or 10'. Certain aspects of the operation of the ALMs in the LAB are controlled by so-called secondary signals that are selected and possibly controlled to some degree by control signal logic circuitry 92 that is common to and shared by all of the ALMs in the LAB. For example, such secondary signals may include clock, clock enable, load, clear, and/or preset signals that are usable by the registers in the ALMs in the LAB. Each ALM also receives several primary signals A/B/etc. from at least some of the interconnection resources 13/14 of the device. (Similar to what is shown in the Lewis et al. reference, these interconnection resources may include global or relatively global elements 13 and more local (to the LAB) elements 14.) At least some output signals of each ALM are to at least some of these interconnection resources 13/14.

The signals that are used by control signal logic circuitry 92 typically come from global 14 and local 13 interconnection resources of the device. So-called "swap" multiplexers 90a, 90b, and 90c are known for increasing signal choice and routing flexibility in selecting signals from logic element input multiplexer ("LEIM") outputs and from global signal selection multiplexer outputs for application to circuitry 92. Like the LEIMs and global signal muxes, multiplexers 90 are typically programmably controlled by CRAMs that are not shown in FIG. 3.

The Lewis et al. reference shows that like secondary signal circuitry 92, it is advantageous to provide for LUT RAM mode one write address decoder and timer circuit (here element 142) for all of the ALMs 10/10' in a LAB. In accordance with the present invention, FIG. 3 shows that this LAB-wide circuitry 142 can get its input signals from the input routing resources of the secondary signal circuitry 92 of the LAB, including the swap input muxes 90 serving circuitry 92. In other words, the input signals to write address decoder and timer circuitry 142 can come from the outputs of swap multiplexers 90.

In addition, in accordance with the present invention, registers 140 may be provided for such inputs to circuitry 142 as write enable and/or write address signals coming from swap muxes 90. Thus in this embodiment (FIG. 3) the write decoder 142 includes or has closely associated with it a number of FFs 140 that synchronize the write enable and write address signals. The write enables may be in the form of a single write enable that controls writing of a single word of some mode-dependent size (1 or 2 bits per ALM as shown in this example). Alternatively, more than one write enable may be provided to further qualify the set of CRAM that are written, such as providing individual write enables for each of the two bits in an ALM, when in 32*2 mode, or other variations using differing numbers of address and write enable bits depending on the mode of the LUT RAM. These variations will be understood by a circuit designer of ordinary skill in memory design. The data inputs for these FFs are connected to the various routing structures (including the swap muxes 90) that feed the secondary signal region 92. (It is emphasized that registers 140 are optional.)

Figure 4:
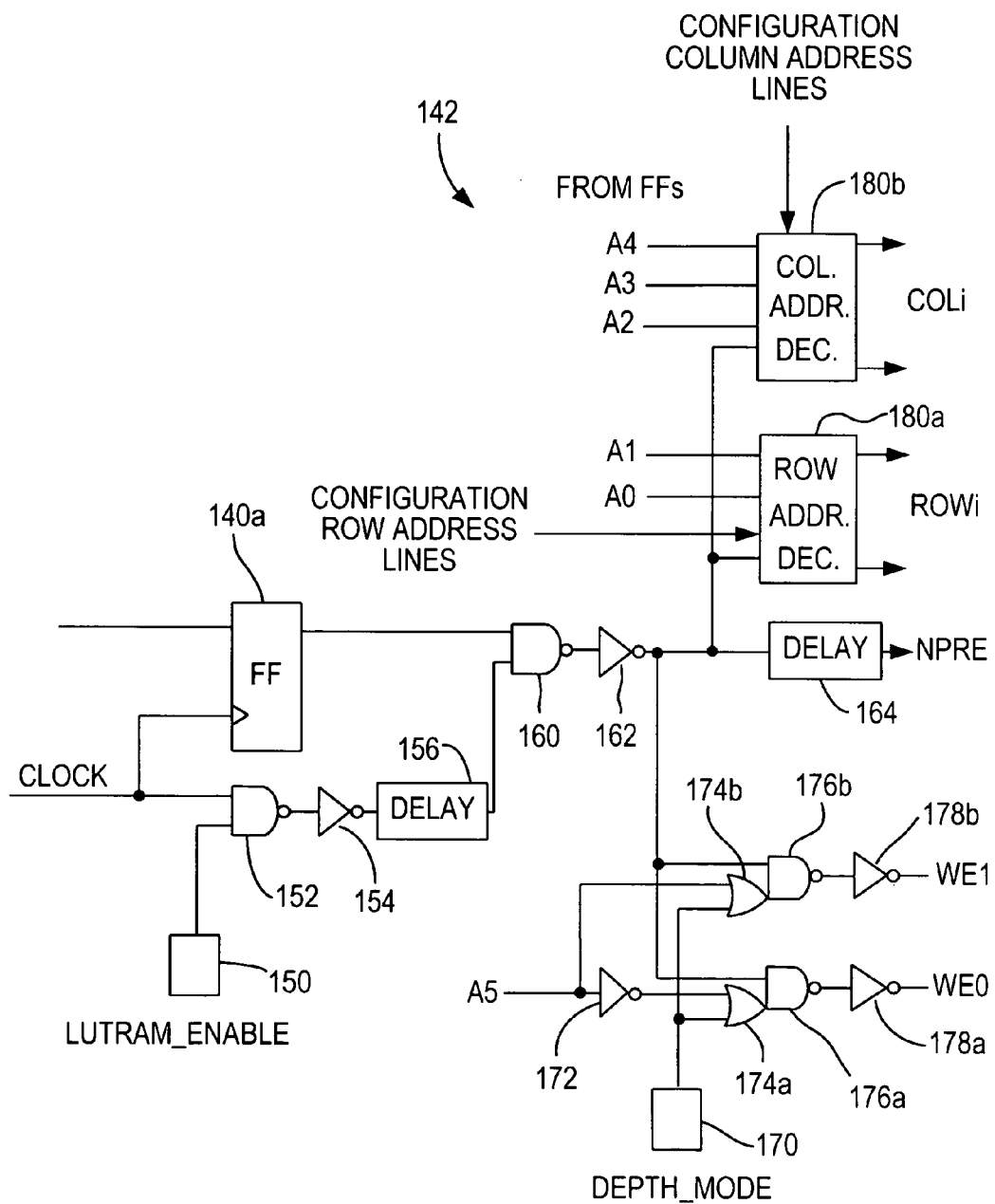
FIG. 4 is a more detailed, but still simplified, schematic block diagram of an illustrative embodiment of a portion of what is shown in FIG. 3 in accordance with the invention.

An illustrative embodiment of write decoder 142 is shown in more detail in FIG. 4. This write decoder embodiment expands on what is shown in the above-mentioned Lewis et al. reference by providing timing for sequencing the write enable (WEi), column (COLi), row (ROWi), and precharge signals (if included (see below)). A configuration bit (CRAM cell) 150 controls whether these signals are enabled for this LAB, so that logic module LABs (as opposed to distributed LUT RAM LABs) do not have any of these signals enabled. One or more CRAMs 170 control the depth of the RAM, so that in various depth configurations the appropriate one or more of the WEi lines are asserted (via OR gates 174a/b, NAND gates 176a/b, and inverters 178a/b), depending on the address A5. In particular, if CRAM 170 is 1, the state of A5 is irrelevant. This corresponds to 32*2 mode. If CRAM 170 is 0, one or the other of WE0 and WE1 is asserted, depending on the logical state of A5. This corresponds to 64*1 mode. (Of course, in all cases the timing of the assertion of these WE signals depends on the output of inverter 162.) From the foregoing it will be seen that depth$_{13}$mode CRAM 170 and the associated circuitry allows the columns of RAM cells in ALMs 10/10' to be subdivided (fractured) or not, as desired. If such a column is subdivided, then the individual subdivisions can be separately addressed using input A5. If such a column is not subdivided, then only the whole column can be addressed and the value of A5 is irrelevant.

The write decoder shown in FIG. 4 includes timer circuitry that performs the write on the positive phase of the clock. (Other embodiments may use the negative phase of the clock. Further, register 140a may be implemented as a level-sensitive latch in some embodiments where the timing of the write allows this.) This timer circuitry includes write enable register 140a, NAND gate 152, inverter 154, delay circuit 156, NAND gate 160, inverter 162, and (optionally) delay circuit 164 (for a precharge signal, if provided (see below)). The write signal output by inverter 162 enables the ROWi and COLi signals (used as shown and described in the Lewis et al. reference), as well as one or more of the WEi signals. It also disables the precharge signal, if present. The timing relationships that are appropriate will be understood by a circuit designer skilled in RAM design. The various row and column configuration write signals are also ORed into the row and column decoders so that configuration logic can write to any desired address, as in the Lewis et al. reference.

Figure 5:
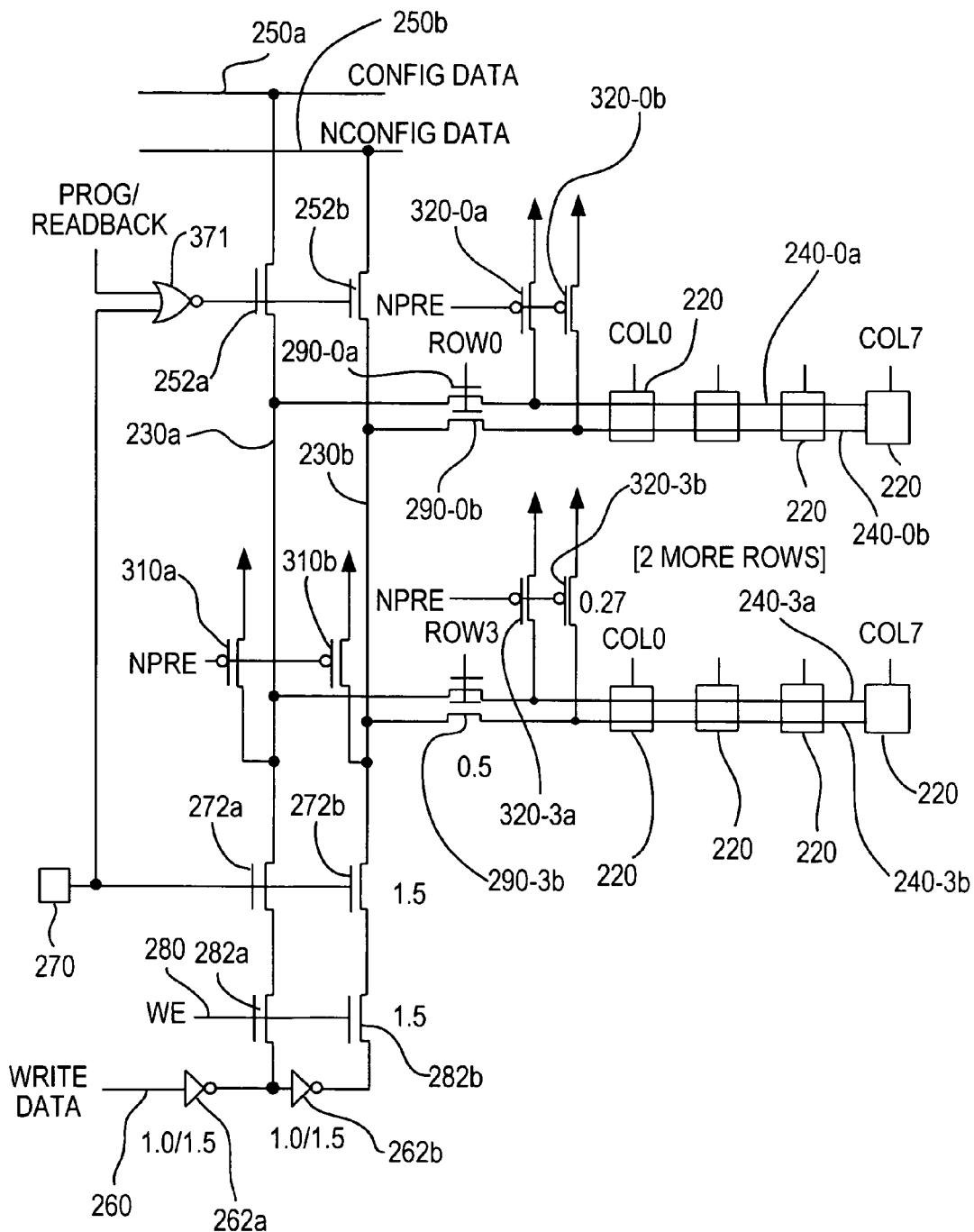
FIG. 5 is a simplified schematic block diagram of illustrative circuitry that uses signals produced by the FIG. 4 circuitry in accordance with the invention.

With regard to the above-mentioned circuitry for producing a precharge control signal, FIG. 5 shows an example of how such a signal may be used in LUT circuitry. FIG. 5 is basically similar to what is shown in the above-mentioned Lewis et al. reference, but with the addition of precharge transistors. Elements that are known from the Lewis et al. reference have reference numbers in the 200 series (although the reference numbers used in FIG. 5 are not intended to correlate with reference numbers used in Lewis et al.). The precharge transistors have reference numbers in the 300 series. The number of rows and columns of LUT RAM cells 220 in FIG. 5 is arbitrary and is not intended to be necessarily the same as the numbers shown in the examples in the Lewis et al. reference or elsewhere in this specification. The data bus shown in FIG. 5 is dual rail, but a single-ended bus may be used instead if compatible with the RAM cell organization employed.

Precharge transistors 310a and 310b are coupled between the rails of LUT-wide data bus 230a/b and VCC to pull those rails up toward VCC when the precharge signal is asserted as described above in connection with FIG. 4. Similarly, precharge transistors 320-0a and 320-0b are coupled between the rails of row-wide data bus 240-0a/b and VCC to pull those rails up toward VCC when the precharge signal is asserted as described above in connection with FIG. 4. Similar precharge transistors 320 are provided for each of the rows of LUT RAM cells 220. All of precharge transistors 310 and 320 are, of course, turned off when the precharge signal is negated.

Other elements in FIG. 5 are known (e.g., from the Lewis et al. reference) and can therefore be described briefly. Leads 250a/b supply configuration data. These leads are connected to leads 230a/b when transistors 252a/b are enabled by a prog/readback signal. User RAM data can be supplied via lead 260 and inverters 262a and 262b. Appropriately programming CRAM 270 allows the depicted LUT to be employed for user RAM by enabling transistors 272a and 272b. A user RAM write enable signal is applied to lead 280 to enable transistors 282a and 282b when data (from lead 260) is to be written to the depicted LUT. Row address signals selectively enable the transistors 290a/b in each row. Column address signals are applied to leads like those labelled COL0 or COL7. One difference compared to Lewis et al. is the addition of control logic to disable read-back of the CRAM when the ALM is used in LUT RAM mode. This is because the contents of the CRAM can change when the ALM is in LUT RAM mode, and any error checking circuitry that periodically checks for soft errors in the CRAM will incorrectly detect the change as an error. Read-back disable circuitry, shown as NOR gate 371 in FIG. 5, prevents read-back from LUT RAMs and causes the read-back to consistently be a logic 0 or 1 depending on the sense of the data line.

Figure 6:
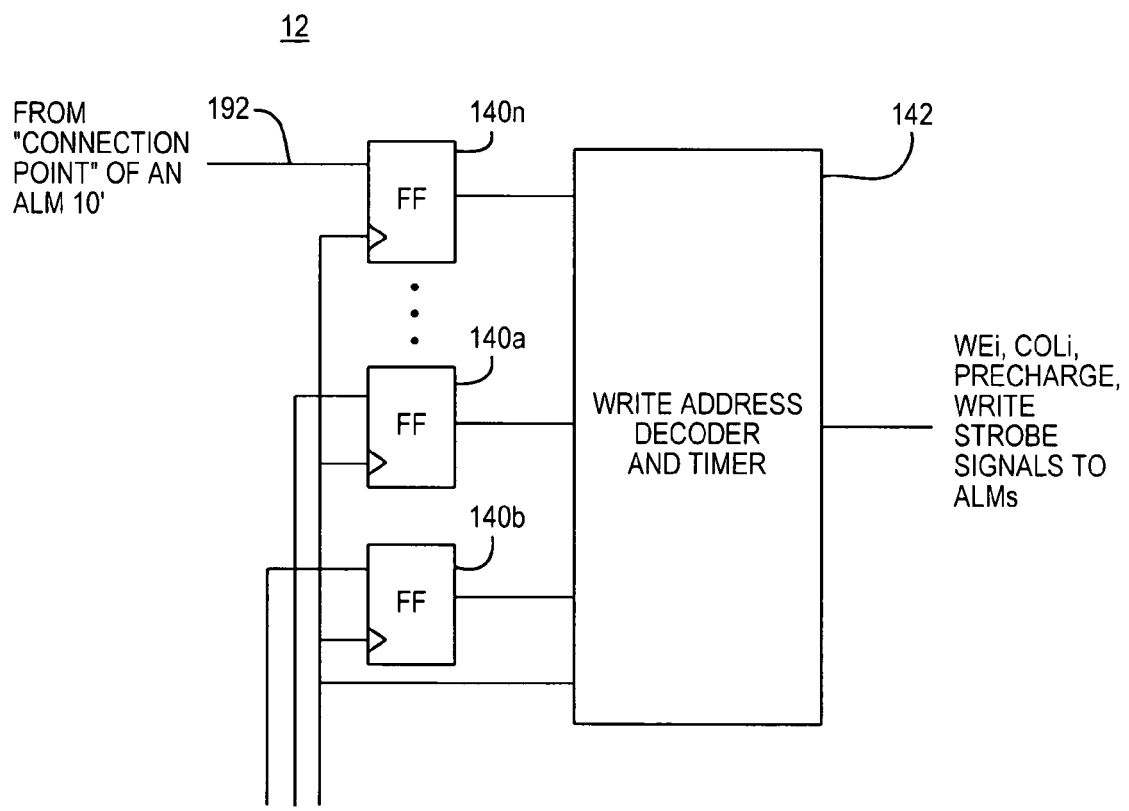
FIG. 6 is a simplified schematic block diagram of an alternative embodiment of a portion of what is shown in FIG. 3 or 4 in accordance with the invention.

Another possible aspect of the invention is illustrated by the "connection point" node 190 shown in FIG. 2 and the extra elements 192 and 140n (as compared to FIG. 3) shown in FIG. 6. This aspect of the invention can be used in the event that the routing resources such as 88 in FIG. 3 for secondary signals are not sufficient to supply all of the write address signals needed by decoder 142. In that event, an input signal that is not needed by an ALM 10' (FIG. 2) in the LAB served by that write address decoder 142 can be "borrowed" to provide an additional input signal to the write address decoder. If, for example, a LAB includes eight ALMs 10', but circuitry in only six of those ALMs is needed to provide read address signals as described above, then circuitry in the two ALMs that are not thus providing read address signals can be used to help provide additional write address signals for the write address decoder 142 of that LAB. Returning to FIG. 2, if the depicted ALM 10' were not one of the ALMs applying a sync read addr signal via its El input, mux 70b, and flip-flop 80b, then that El input would be available to provide an additional write address signal to the associated write address decoder 142. This is done via connection point 190 in FIG. 2, which is connected to input lead 192 in FIG. 6. An additional flip-flop 140n is provided in FIG. 6 in order to register this signal for application to write address decoder 142. The 190 to 192 connection may be buffered to avoid unduly loading the associated El input.

Figure 7:
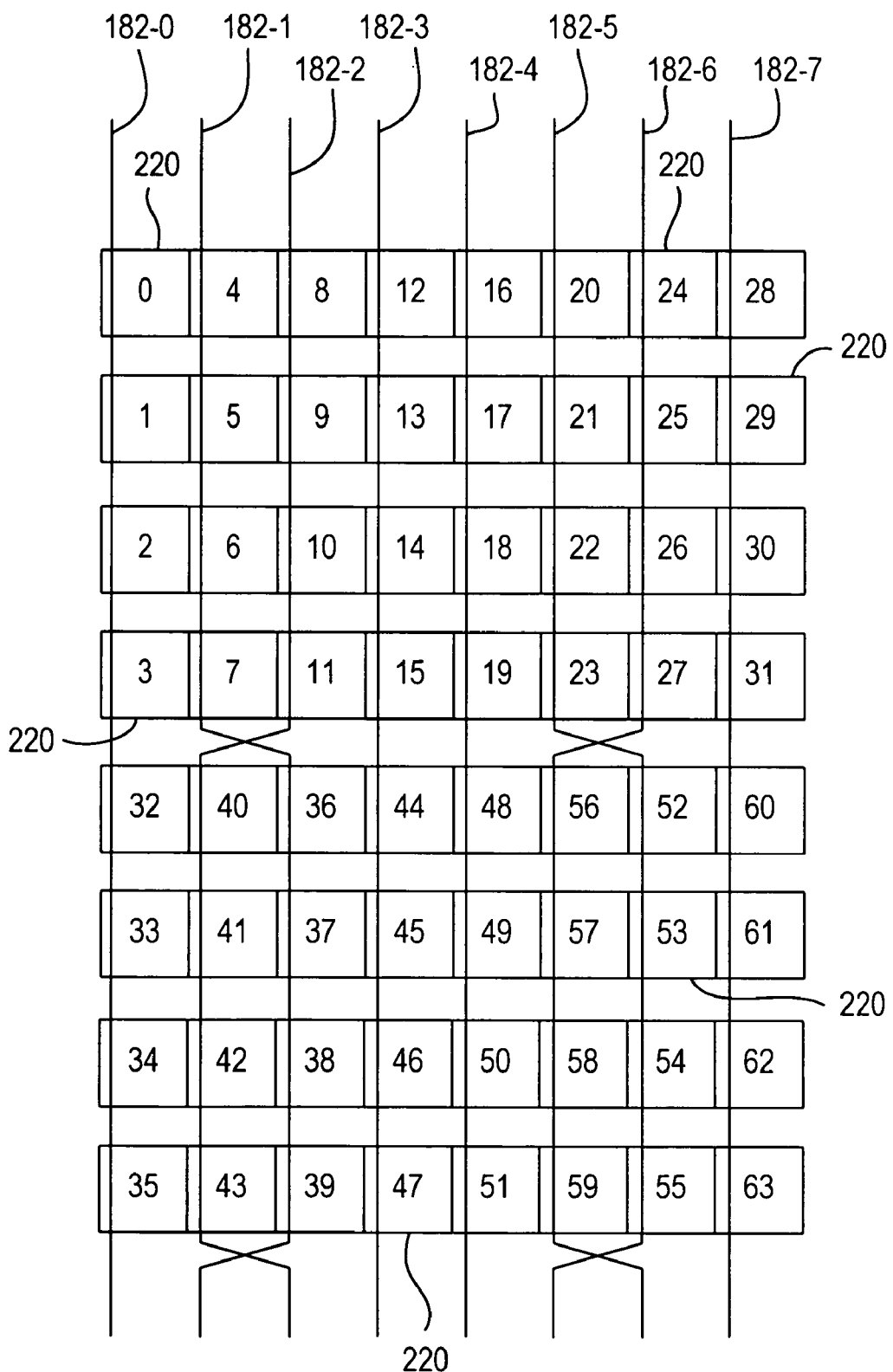
FIG. 7 is a simplified schematic block diagram of an illustrative embodiment of circuitry that can be used in accordance with the invention.

In the ALMs 10/10' described above, it will be noted that the read address pins differ in their order between the top and bottom halves of the ALM. In particular, input pins DC0 and DC1 are applied as the third and fourth address pins to the top half of the ALMs in FIGS. 1 and 2, but as the fourth and third address pins to the bottom half of those ALMs. Thus the read addresses for the top half of these ALMs are A, B, DC0, DC1, etc., while the bottom half will use A, B, DC1, DC0, etc. This implies that writing the data into the ALM needs to take this difference of ordering into account. One way of doing this is to "twist" certain ones of the column write address lines 182 as shown in FIG. 7. FIG. 7 shows the locations of CRAM bits 220 as they would be addressed using pins A, B, DC0, DC1, etc. It can be seen that the ordering of the bits in a row is different between the top four rows and the bottom four rows, but both reads and writes address the CRAM with a consistent ordering. To accomplish this, column write address lines 182-1 and 182-2 (e.g., among the outputs of column address decoder 180b in FIG. 4) are swapped or twisted in going from the top half of the CRAM to the bottom half. Similarly, column write address lines 182-5 and 182-6 are swapped or twisted in going from the top half of the CRAM to the bottom half.

Figure 8:
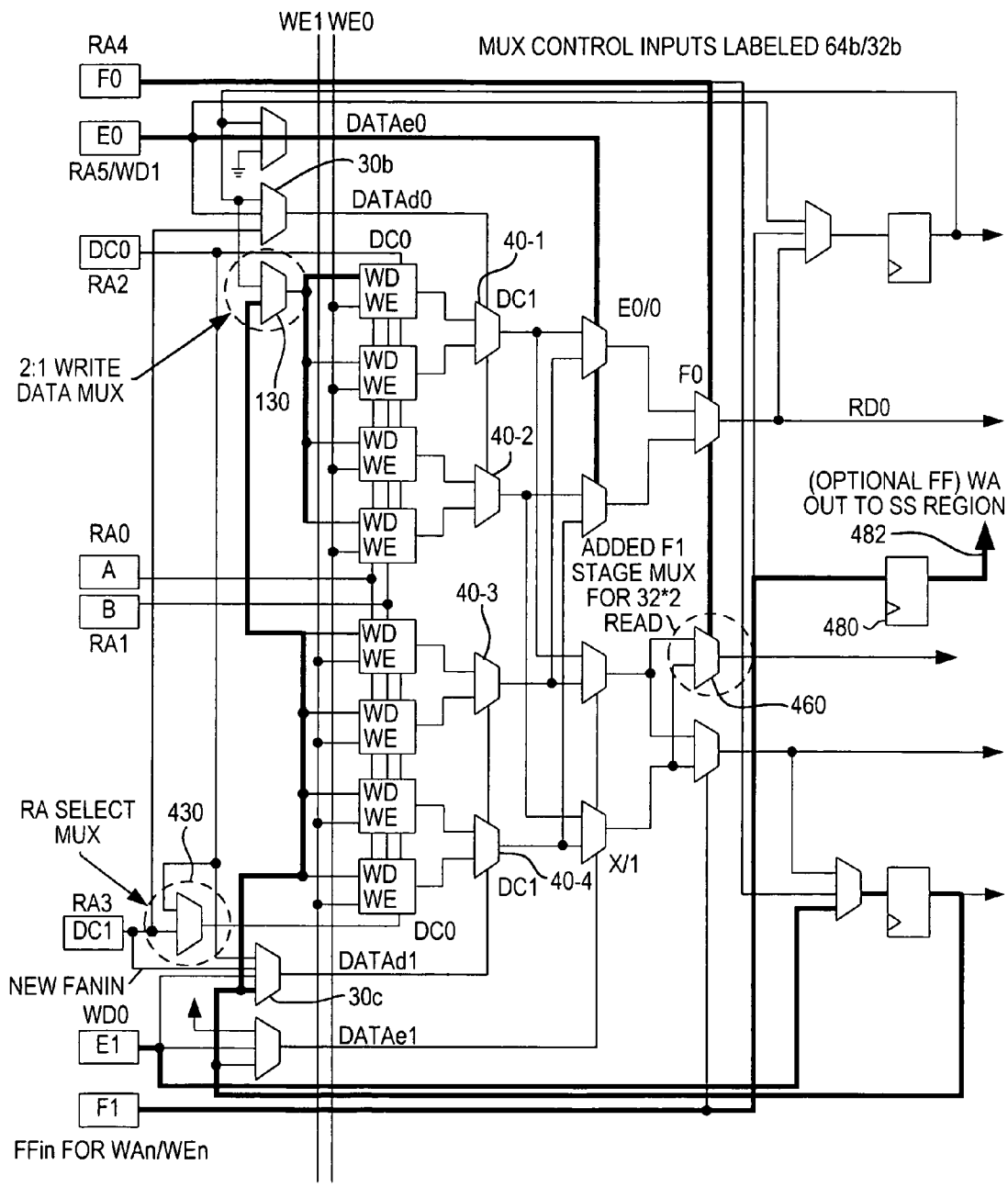
FIG. 8 is a simplified schematic block diagram that is generally similar to FIGS. 1 and 2 and that shows illustrative embodiments of other possible features of the invention.

Another option is to provide a distinct multiplexer to allow consistent bit ordering between the top and bottom half for reads. This avoids the need to twist the write column lines. Existing muxes 30b and 30c already provide for the programmable selection for the fourth stage of the ALM, implementing read address 3 ("RA3"). In the previously described circuitry, muxes 30b and 30c include fan-ins for various logic and feedback signals, but include DC1 and DC0, respectively, on the top and bottom. However, DC0 and DC1 directly drive the third stage of the top and bottom halves, respectively. Therefore, what is required is the ability to select the same signal for read address 2 ("RA2") on both top and bottom, as well as the other one of DC0 and DC1 for RA3 on both top and bottom. It does not matter which of DC0 and DC1 is selected for RA2 and which for RA3, as long as it is possible to select one for RA2 and the other for RA3 consistently across both halves of the ALM. This is accomplished by adding a fan-in to the mux feeding the fourth LUT input stage, and a new multiplexer for the third LUT input stage, such that DC0 and DC1 can be used in a consistent order. In the version shown in FIG. 8, DC1 is chosen to be used for RA2, and a 2:1 multiplexer 430 ("RA select mux") is added to one half of the ALM to allow DC0 to be used as RA2 for both halves of the ALM. An extra fan-in is added to the multiplexer 30c feeding the fourth stage of the LUT to allow DC1 to be used as RA3 for both halves of the ALM. FIG. 8 shows the ALM write data path configured in the 64*1 mode, with labels that show signal selection in both modes.

The relevant aspect of this part of the invention is multiplexers that enable a consistent ordering of input signals between stages in the ALM or LUT. Note that in FIG. 8, RA4 feeds the sixth LUT mux stage, and RA5 feeds the fifth stage, in contrast to their names. This is for convenience of naming the signals, since the RA5 signal is also used for the WD1 (write data 1), and it is convenient to have a fixed association of pins to names (otherwise pin RA4 would move from F0 to E0 in 32*2 mode).

Another optional feature of the invention relates to use of the secondary signals for write addresses. It may be desirable to avoid using all of the secondary signals for the write address and enable signals, because this prevents their use for other purposes that may be needed by the LAB when used as distributed memory. For example, a clock enable is commonly required. In order to support this, it is possible to take a different approach, which dedicates one pin of each ALM to a write address or write enable in each of the ALMs. This variation is also shown in FIG. 8 in connection with ALM input F1.

Figure 9:
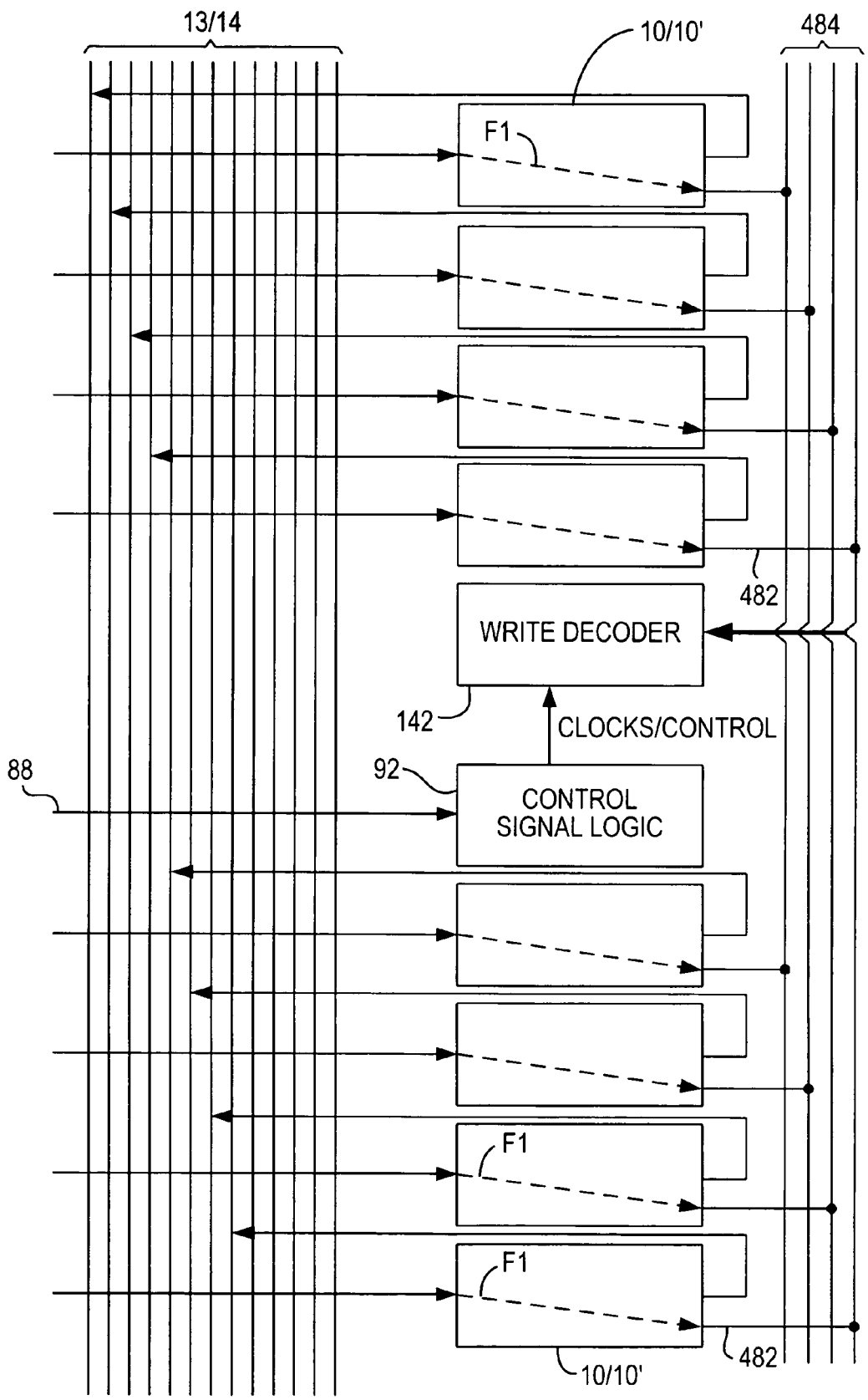
FIG. 9 is a simplified schematic block diagram of an illustrative embodiment of further circuitry in accordance with one of the aspects of the invention shown in FIG. 8.

FIG. 8 also illustrates a flip-flop (register) 480 in the path from the F1 input to the write decoder. This flip-flop is optional and not essential to the invention. Using the arrangement shown in FIG. 8 (with or without register 480), each ALM provides a distinct write address or control signal through the F1 input to a corresponding pin on the write decoder (e.g., 142 in FIG. 3). FIG. 9 illustrates this. A set of wires 484 couples the write address signal 482 from the individual ALMs to write decoder 142. Further, some of the control signals, such as clock signals, may be provided from the control signal selection logic circuitry to the write decoder.

It should be noted that this technique requires a dedicated input pin on one ALM for each write address and control signal (such as write enable) that is connected using this means. Therefore this may reduce or eliminate the possibility of using the flip-flops 80 inside the ALM as extra flip-flops for read address or other purposes.

Further, in order to support this aspect, another feature is needed. The previously described version of the invention (e.g., in connection with FIG. 2) required that the signal RA4 be duplicated when the ALM is configured in 32*2 mode. This is because the F0 and F1 inputs are directly connected to the final stages 60 of multiplexing in the top and bottom halves, respectively, of the ALM. In 32*2 mode it is necessary to use both of these final multiplexers 60-1 and 60-2, with the consequence that two pins are needed to input a single signal. An alternative, also shown in FIG. 8, eliminates the need for two inputs to convey a single signal by introducing a duplicate of the final stage F1 multiplexer, labeled "added F1 stage mux" 460. This reduces, by one, the number of pins required in 32*2 mode and ensures that the F1 pin is not needed for the read address in any mode, making it available for a write address as described in the immediately preceding paragraphs.

Note that the ALM is symmetrical between the top half and bottom half, and the added hardware can therefore be located in either top or bottom half, as long as the relative locations are preserved. Thus, for example, FIG. 2 shows extra write data mux 130 in the bottom half, but FIG. 8 places it in the top half.

It will be understood that the foregoing is only illustrative of the principles of the invention, and that various modifications can be made by those skilled in the art without departing from the scope and spirit of the invention. For example, the various aspects of the invention can be used alone or in any combination as desired. As another example of possible modifications, the number of RAM cells in a LUT can be more or less than the number(s) illustratively shown and described herein. Similarly, the number of ALMs in a LAB can be more or less than the number(s) illustratively shown herein.

The invention claimed is:

1. Look-up table circuitry comprising:
   a plurality of memory cells;
   circuitry for supplying configuration data to the memory cells; and
   circuitry for alternatively supplying user data to the memory cells, wherein the circuitry for alternatively supplying is controllable to select a number of user data bits that are applied in parallel to the memory cells so that depth of user data memory implemented by the memory cells can be varied, wherein the circuitry for alternatively supplying comprises:
   write enable circuitry for selecting a number of the memory cells to apply a write enable signal to consistent with the depth of user data memory being implemented by the memory cells.

2. The look-up table circuitry defined in claim 1 further comprising:
   configuration memory circuitry for controlling the selection made by the circuitry for alternatively supplying.

3. Look-up table circuitry comprising:
   a plurality of memory cells;
   circuitry for supplying configuration data to the memory cells; and
   circuitry for alternatively supplying user data to the memory cells, wherein the circuitry for alternatively supplying is controllable to select a number of user data bits that are applied in parallel to the memory cells so that depth of user data memory implemented by the memory cells can be varied,
   wherein the circuitry for alternatively supplying comprises:
   write enable circuitry for selecting a number of the memory cells to apply a write enable signal to consistent with the depth of user data memory being implemented by the memory cells, wherein the memory cells are organized in rows and columns, wherein different portions of at least two columns can be addressed for reading by a common read address signal, and wherein a column write address signal is applied to those different portions of those two columns.

4. The circuitry defined in claim 3 wherein second portions of the two columns that are not addressed for reading by the common read address signal can be addressed for reading by a second common read address signal, and wherein a second column write address signal is applied to those second portions.

5. Look-up table circuitry comprising:

a plurality of memory cells;

circuitry for supplying configuration data to the memory cells; and circuitry for alternatively supplying user data to the memory cells, wherein the circuitry for alternatively supplying is controllable to select a number of user data bits that are applied in parallel to the memory cells so that depth of user data memory implemented by the memory cells can be varied, wherein first and second subsets of the memory cells are addressed for reading using first and second separate read address conductors, respectively, and wherein the circuitry further comprises routing circuitry for selectively allowing either a same or two different signals to be applied to the conductors.

6. The circuitry defined in claim 5 wherein the first and second subsets are further addressed for reading using third and fourth separate read address conductors, respectively, and wherein the circuitry further comprises second routing circuitry for selectively allowing either a second same or two different signals to be applied to the third and fourth conductors.

7. The circuitry defined in claim 6 wherein the same signal and the second same signal have sources that are used for the two different signals employed by both the routing circuitry and the second routing circuitry.

8. Look-up table circuitry comprising:

a plurality of memory cells;

multiplexer circuitry responsive to a plurality of input signals for selecting contents of one of the memory cells as an output signal;

register circuitry;

routing circuitry for selectively routing one of the input signals or the output signal to the register circuitry for registration to produce a registered signal; and further routing circuitry for applying the registered signal to write data input terminals of the memory cells.

9. The look-up table circuitry defined in claim 8 further comprising:

circuitry for selectively supplying configuration data to the memory cells.

10. Look-up table circuitry comprising:

a plurality of memory cells;

read circuitry that can provide (1) an output signal that is selected from any one of the memory cells or (2) two output signals, each of which is selected from a respective one of different, first and second subpluralities of the memory cells;

first and second registers; and routing circuitry for routing (1) an output signal of each of the first and second registers to write drivers of the memory cells in the first and second subpluralities, respectively, or (2) an output signal of one of the first and second registers to the write drivers of all of the memory cells.

11. The look-up table circuitry defined in claim 10 wherein the first and second subpluralities are mutually exclusive of one another.

12. The look-up table circuitry defined in claim 11 wherein the first and second subpluralities include equal numbers of the memory cells.

13. The look-up table circuitry defined in claim 11 wherein the routing circuitry comprises:

multiplexer circuitry for selectively applying to the write drivers of the memory cells in the first subplurality either (1) the output signal of the first register or (2) the output signal of the second registers.

14. The look-up table circuitry defined in claim 13 wherein the multiplexer circuitry is programmably controlled.

* * * * *